(12) United States Patent
Park et al.

(10) Patent No.: US 12,660,673 B2
(45) Date of Patent: Jun. 16, 2026

(54) SEMICONDUCTOR DEVICE AND METHOD OF FORMING AN ANTENNA-IN-PACKAGE STRUCTURE

(71) Applicant: JCET STATS ChipPAC Korea Limited, Incheon (KR)

(72) Inventors: Yejin Park, Incheon (KR); Seunghyun Lee, Incheon (KR); Heesoo Lee, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 455 days.

(21) Appl. No.: 18/190,047

(22) Filed: Mar. 24, 2023

(65) Prior Publication Data

US 2024/0321664 A1     Sep. 26, 2024

(51) Int. Cl.
| | |
|---|---|
| *H01L 23/66* | (2006.01) |
| *H10W 44/20* | (2026.01) |
| *H10W 70/63* | (2026.01) |
| *H10W 72/20* | (2026.01) |
| *H10W 74/10* | (2026.01) |
| *H01L 23/00* | (2006.01) |
| *H01L 23/31* | (2006.01) |
| *H01L 23/498* | (2006.01) |
| *H10W 74/00* | (2026.01) |
| *H10W 90/00* | (2026.01) |

(52) U.S. Cl.
CPC ......... *H10W 74/121* (2026.01); *H10W 44/20* (2026.01); *H10W 70/635* (2026.01); *H10W 72/20* (2026.01); *H10W 74/117* (2026.01);

*H10W 74/127* (2026.01); *H10W 44/209* (2026.01); *H10W 74/00* (2026.01); *H10W 90/734* (2026.01)

(58) Field of Classification Search
CPC ............. H01L 23/3135; H01L 23/3142; H01L 23/49827; H01L 23/66; H01L 2223/6616; H01L 2924/1421; H01L 2223/6677; H01L 21/56; H01L 23/3121; H01L 23/49811; H01L 25/0655; H01Q 1/2283
See application file for complete search history.

(56) References Cited

U.S. PATENT DOCUMENTS

| | | | | |
|---|---|---|---|---|
| 5,473,512 A | * | 12/1995 | Degani | ................... H01L 24/83 |
| | | | | 174/557 |
| 10,734,704 B2 | | 8/2020 | Ho et al. | |
| 11,095,037 B2 | | 8/2021 | Kim et al. | |
| 2019/0051989 A1 | * | 2/2019 | Kim | ..................... H01Q 19/062 |
| 2019/0103365 A1 | * | 4/2019 | Singh | ..................... H01L 23/552 |
| 2019/0326256 A1 | * | 10/2019 | Chang | ................... H01L 23/552 |
| 2021/0257745 A1 | * | 8/2021 | Liao | ......................... H01Q 1/48 |

(Continued)

*Primary Examiner* — Kretelia Graham
*Assistant Examiner* — Hamna Fathima Iqbal
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate including an antenna formed in a first area of the substrate. An electrical component is disposed over a second area of the substrate. An interconnect structure is disposed over a third area of the substrate. A first encapsulant is deposited over the electrical component and interconnect structure. A second encapsulant is disposed over the antenna. The second encapsulant includes a higher dielectric constant than the first encapsulant.

15 Claims, 15 Drawing Sheets

(56) References Cited

U.S. PATENT DOCUMENTS

2021/0351116 A1 * 11/2021 Ganesan ................ H05K 7/023
2022/0246533 A1    8/2022 Cho et al.
2022/0375884 A1   11/2022 You

* cited by examiner

SEMICONDUCTOR DEVICE AND METHOD OF FORMING AN ANTENNA-IN-PACKAGE STRUCTURE

FIELD OF THE INVENTION

The present invention relates in general to semiconductor devices and, more particularly, to a semiconductor device and method of forming an antenna-in-package (AiP) structure.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g., multiple semiconductor die and myriad discrete components to support the semiconductor die, disposed on one or more substrates to perform necessary electrical functions. Such a package is commonly referred to as a system-in-package (SiP) module. SiP modules and other semiconductor packages that include one or more antennae for transmitting and receiving electromagnetic signals are commonly called antenna-in-package (AiP) modules.

In recent years, 5G technology has been implemented by a high frequency AiP with system chips and an antenna integrated into one package. The AiP concept has been adopted for mobile handsets and other portable multimedia devices to reduce overall device size. However, AiP modules now require reduced interface pitches, higher interface pin counts, reduced thickness, and higher integration to continue to improve performance and further reduce size. Therefore, a need exists for improved AiP structures.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
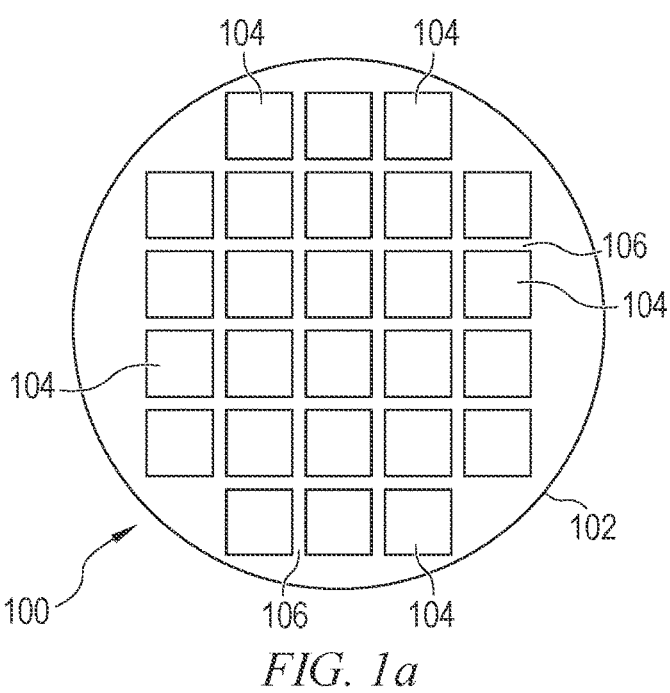
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
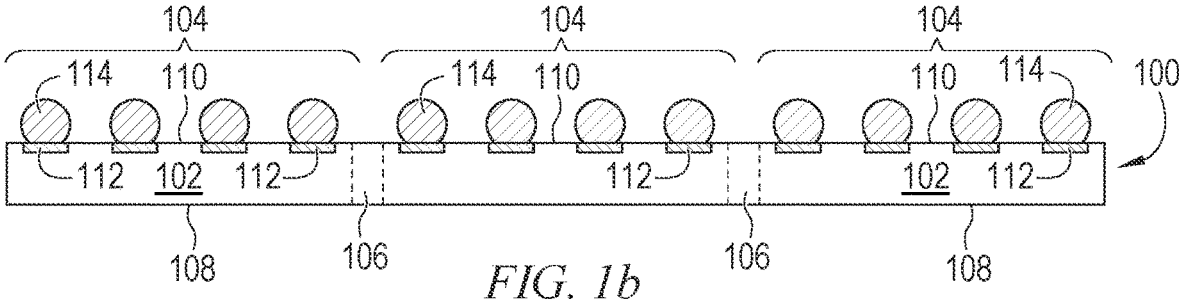

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bumps, micro bumps, or another type of electrical interconnect.

Figure 1C:
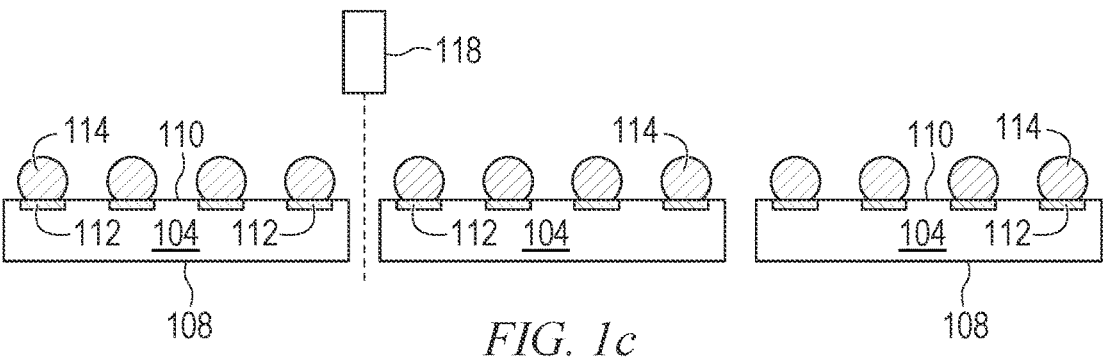

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B:
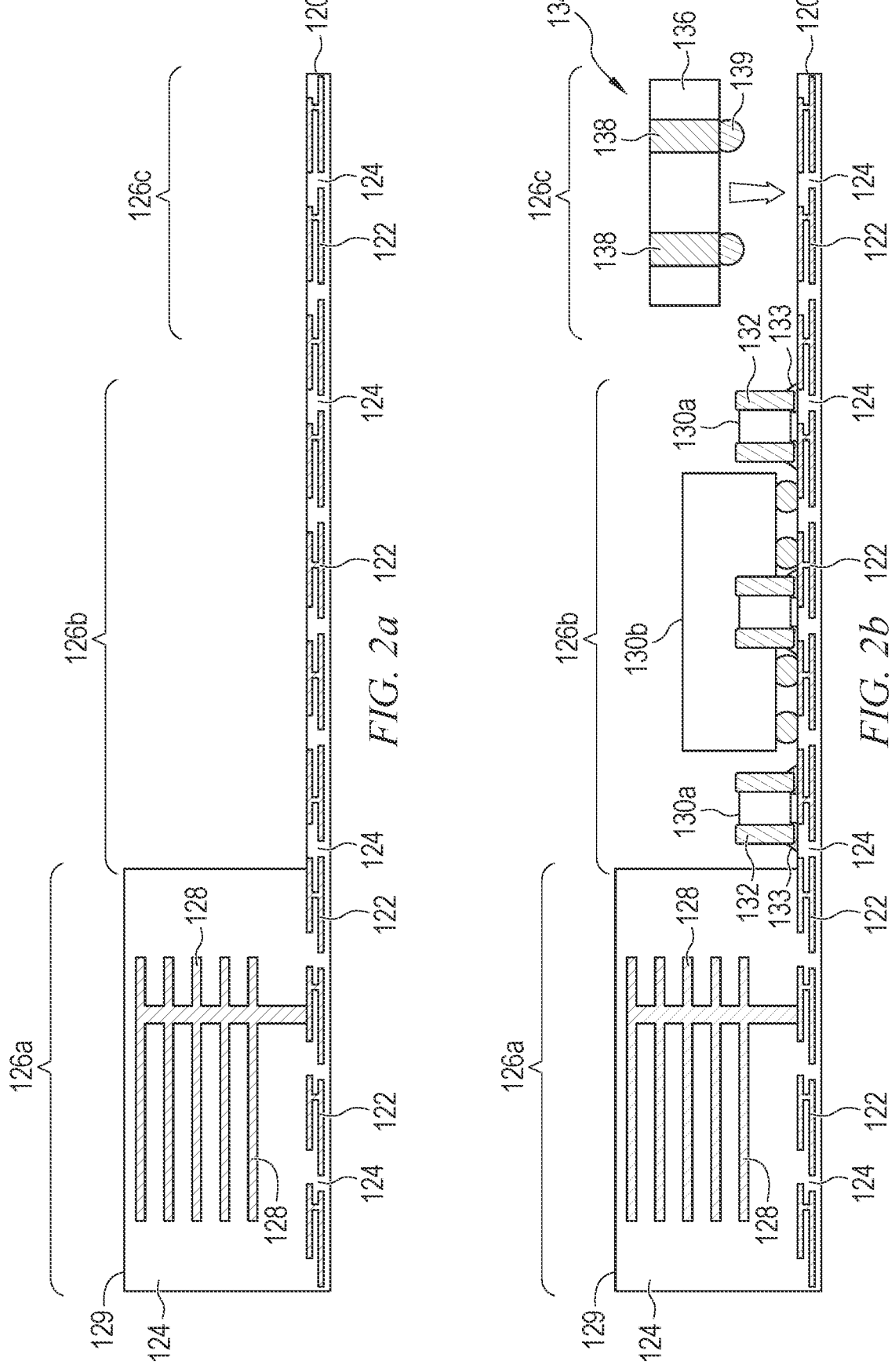
FIGS. 2a-2j illustrate forming an AiP module.

FIGS. 2a-2j illustrate a process of forming an improved antenna-in-package (AiP) module. FIG. 2a shows a cross-sectional view of multi-layered interconnect substrate 120 including conductive layers 122 and insulating layers 124. While only a single substrate 120 suitable to form a single semiconductor package is shown, hundreds or thousands of units are commonly manufactured and processed as part of a single substrate before being singulated from each other, using the same steps described herein performed en masse. A separate substrate 120 could also be used for each unit being manufactured, the substrate being singulated before the steps shown in FIGS. 2a-2j and a plurality of individual substrates being placed on a common carrier for processing.

Conductive layers 122 can be one or more layers of Al, Cu, Sn, Ni, Au, Ag, or other suitable electrically conductive material. Conductive layers 122 can be formed using PVD, CVD, electrolytic plating, electroless plating, or another suitable metal deposition process. Conductive layers 122 provide horizontal electrical interconnect across substrate 120 and vertical electrical interconnect between layers of the substrate. Portions of conductive layers 122 can be electrically common or electrically isolated depending on the design and function of the package being formed.

Insulating layers 124 contain one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers 124 can be formed using PVD, CVD, printing, lamination, spin coating, spray coating, sintering, thermal oxidation, or another suitable process. Insulating layers 124 provide isolation between conductive layers 122. Any number of conductive layers 122 and insulating layers 124 can be interleaved over each other to form substrate 120. Any other suitable type of package substrate or leadframe is used for substrate 120 in other embodiments.

An antenna block 126a is formed as part of substrate 120 by successively forming conductive layers 122 and insulating layers 124 to form antennae 128. Antennae 128 are conductive structures built up as part of the process of forming substrate 120. After substrate 120 is completely formed within component area 126b and interconnect area 126c, additional conductive layers 122 and insulating layers 124 are formed within the area for antenna block 126a to increase the thickness in that area while the component area and interconnect area remain at a lower thickness. A top surface 129 of antenna block 126a is at a higher level relative to the top surface of substrate 120 within component area 126b and interconnect area 126c.

Any suitable type of antenna can be formed, the illustrated structures are only for purpose of explanation and do not in any way limit the types of antennae that can be used. In some embodiments, antenna block 126 is formed with antennae 128 exposed from a top or side surface of the antenna block. In other embodiments, antenna block 126a is formed as a separate block from substrate 120 and then mounted onto the substrate after formation. Antenna block 126a is a chip antenna in one embodiment.

In FIG. 2b, electrical components 130a and 130b, and any other desired electrical components, are disposed on substrate 120 in component area 126b and electrically and mechanically connected to conductive layers 122. Electrical components 130 are positioned over substrate 120 using a pick and place operation. For example, electrical components 130a can be discrete electrical devices, such as diodes, transistors, resistors, capacitors, and inductors. Electrical components 130b can be, or be made similar to, semiconductor die 104 from FIG. 1c with bumps 114 oriented toward substrate 120. Alternatively, electrical components 130 can include any other desired semiconductor die, semiconductor packages, surface mount devices, RF components, or discrete electrical devices. Any of the electrical components 130 can also have integrated passive devices (IPDs) formed thereon.

Electrical components 130 are brought into contact with a conductive layer 122 of substrate 120. Terminals 132 of electrical components 130a are electrically and mechanically connected to conductive layer 122 using solder or conductive paste 133. Electrical components 130b are electrically and mechanically connected to conductive layer 122 by reflowing bumps 114 onto contact pads of the conductive layer.

One or more PCB units, e-bars, or modular interconnect units 134 are disposed over substrate 120 within interconnect area 126c in a similar manner to electrical components 130. Modular interconnect unit 134 is disposed onto substrate 120 using a pick-and-place machine. Modular interconnect unit 134 includes an insulating core 136 and a plurality of conductive vias 138 extending through the insulating core. Solder bumps 139 are disposed between substrate 120 and conductive vias 138 and are reflowed to electrically and mechanically connect modular interconnect unit 134 to substrate 120. Modular interconnect unit 134 optionally includes contact pads, solder resist layers, or both formed over the top, bottom, or both surfaces of the modular interconnect unit. Modular interconnect unit 134 provides vertical interconnect from substrate 120, which will be explained in further detail below.

Figures 2C, 2D:
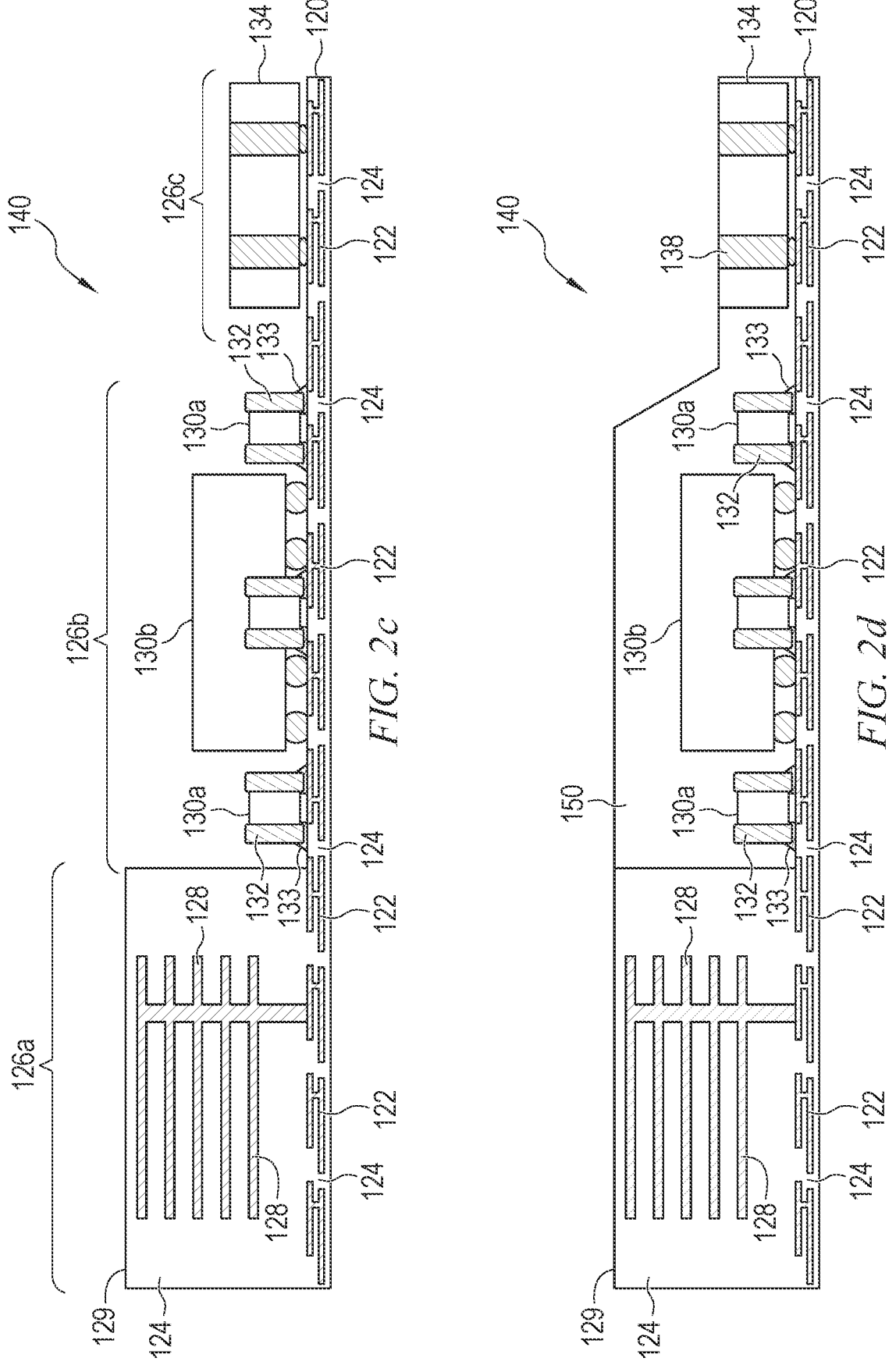

FIG. 2c illustrates electrical components 130 electrically and mechanically connected to conductive layers 122 of substrate 120. Any desired combination of electrical components of any suitable type can be used to form a semiconductor package on substrate 120. Electrical components can also be disposed over the bottom surface or within the layers of substrate 120.

In FIG. 2d, encapsulant or molding compound 150 is deposited over and around substrate 120, electrical components 130 and modular interconnect unit 120 using a paste printing, compressive molding, transfer molding, liquid encapsulant molding, vacuum lamination, spin coating, or another suitable applicator. Encapsulant 150 can be liquid or granular polymer composite material, such as epoxy resin, epoxy acrylate, or polymer, with or without an added filler. Encapsulant 150 is non-conductive, provides structural support, and environmentally protects the semiconductor device from external elements and contaminants. Encapsulant 150 completely covers tops and all sides of electrical components 130, while modular interconnect structure 134 remains exposed from the encapsulant for subsequent electrical interconnect.

Encapsulant 150 is molded with a stepped shape so that a top surface of the encapsulant in a region adjacent to antenna block 126a is coplanar to a top surface 129 of the antenna block and the top surface of the encapsulant in a region adjacent to modular interconnect unit 134 is coplanar to the modular interconnect unit. The areas of different heights of encapsulant 150 correspond to the encapsulant being thicker in component area 126b and thinner in interconnect area 126c, with a linear height gradient between the areas of differing thicknesses, but that does not need to be true in all embodiments. The stepped shape of encapsulant 150 is provided by utilizing a mold chase with the desired shape or by any other suitable means. In other embodiments, a height of modular interconnect unit 134 is approximately the same as a height of antenna block 126a so that all three of the encapsulant 150, antenna block, and modular interconnect structure top surfaces are coplanar without a stepped encapsulant.

Figure 2E:
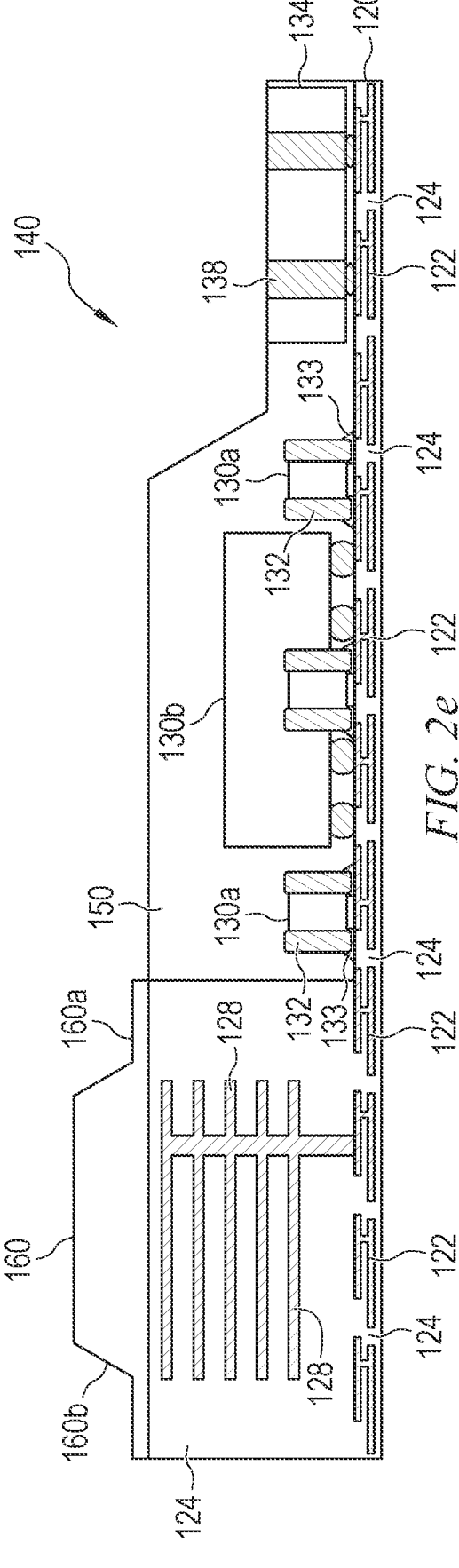
Figure 2F:
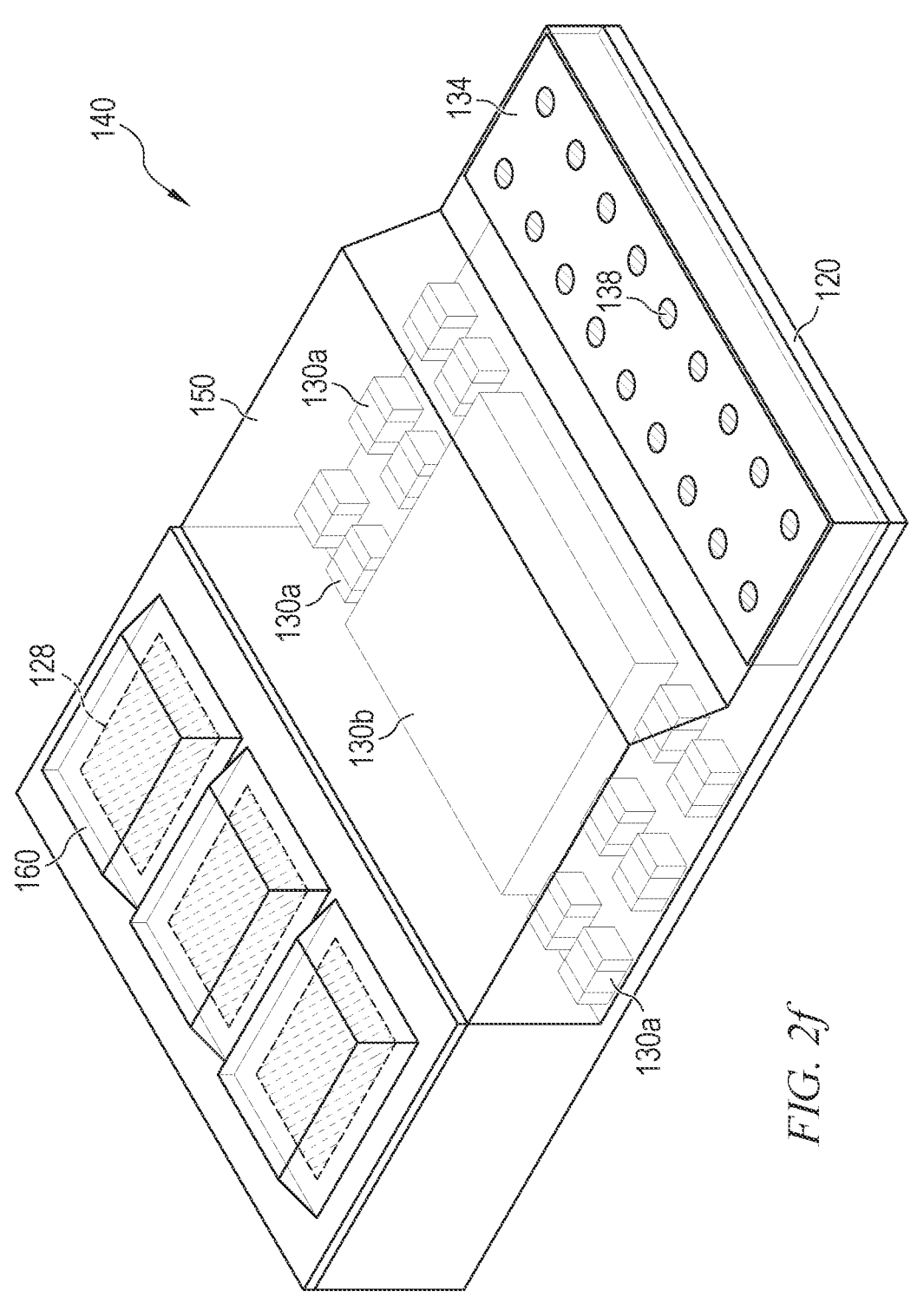

In FIG. 2e, a high dielectric constant (high-k) encapsulant 160 is deposited over antenna block 126a. FIG. 2f shows a perspective view of package 140 with both encapsulant 150 and high-k encapsulant 160. High-k encapsulant 160 is deposited in a similar process and is generally similar to encapsulant 150. A mold chase with the desired shape for high-k encapsulant 160 is used to form the high-k encapsulant only over antenna block 126a.

High-k encapsulant 160 is optionally formed with a flat portion 160a that extends horizontally to fully cover antenna block 126a. A trapezoidal portion 160b of high-k encapsulant 160 is formed over each individual antenna 128. The flat portion 160a aids in molding by allowing the mold to be formed as one continuous body across all antennae 128 for an entire column or row of packages 140 formed at once. Flat portion 160a may have a different shape that does not completely cover antenna block 126a or that extends past the antenna block onto encapsulant 150.

The thicker trapezoidal portion 160b is formed over each antenna 128. The perspective of FIG. 2f shows three antennae 128 and three corresponding trapezoids of high-k encapsulant 160. In other embodiments, the number and shape of antennae 128 is different, with the thicker portions of high-k encapsulant 160 modified accordingly to ensure a thicker portion covering the footprint of all antennae 128. The sloped sidewalls of trapezoidal portions 160b may be rounded, angled differently, vertical, or another suitable shape. In other embodiments, the entire area of antenna block 126a is covered by high-k encapsulant 160 at the same thickness of trapezoid portion 160b. However, the thicker portion of high-k encapsulant 160 is most useful directly over and near where antennae 128 are actually formed. Thus, thicker trapezoid portions 160b are formed over antennae 128 while other areas have thinner flat portion 160a to reduce material costs.

The primary difference between high-k encapsulant 160 and encapsulant 150 is the material used. High-k encapsulant 160 has a higher dielectric constant than encapsulant 150, which improves the performance of antennae 128 but is not necessary for use with electrical components 130. Using two different molding steps allows the more expensive high-k encapsulant 160 to be used just over antenna block 126a while cheaper conventional encapsulant 150 is used for the main body of package 140.

Figures 2G, 2H:
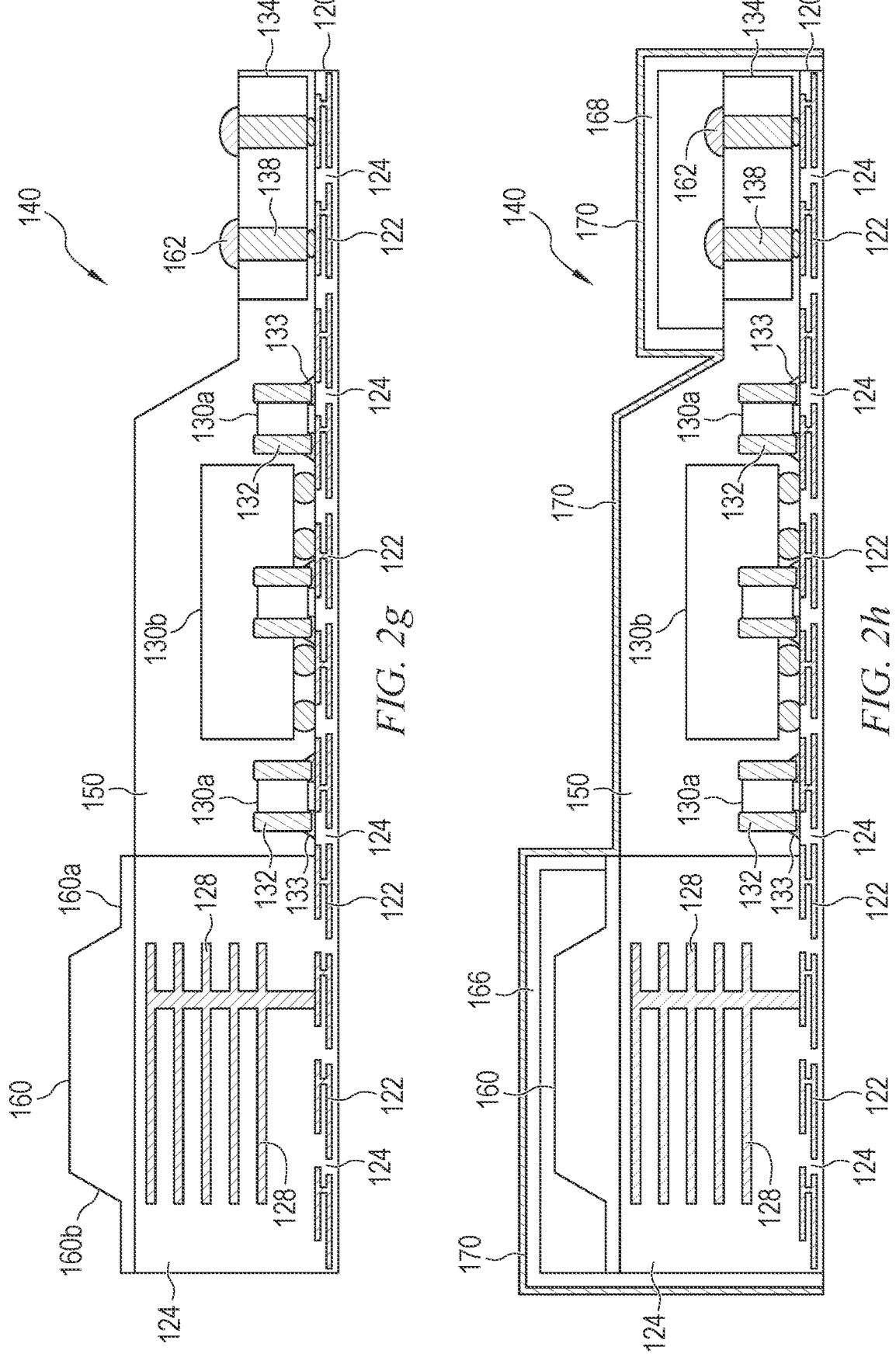

In FIG. 2g, solder bumps 162 are formed over conductive vias 138 of modular interconnect unit 134. Solder bumps 162 are formed in a similar manner to bumps 114 being formed over semiconductor die 104, e.g., solder paste printing, ball drop, or another solder dispensing method followed by reflow to form balls or bumps. Another suitable interconnect structure is formed or disposed over modular interconnect unit 134 in other embodiments. Bumps 162 can be formed at an earlier or later manufacturing stage as convenient.

In FIG. 2h, shielding layer 170 is deposited, printed, sputtered, plated, or otherwise formed over semiconductor package 140. Plating can be performed by CVD, PVD, other sputtering methods, electroless plating, or other suitable metal deposition process. Shielding layer 170 includes one or more layers of Al, Cu, Sn, Ni, Au, Ag, or other suitable electrically conductive material. When multiple packages 140 are formed as a panel of devices over a single substrate 120, the panel is typically singulated prior to forming shielding layer 170 so that side surfaces of the packages are exposed to the metal deposition process. Shielding layer 170 totally covers top and side surfaces of encapsulant 150 within component area 126b. In most embodiments, shielding layer 170 extends down side surfaces of package 140 to substrate 120 to physically and electrically contact exposed portions of conductive layer 122, thereby connecting the shielding layer to an electrical ground.

During plating of shielding layer 170, a mask 166 is disposed over antenna block 126a and a mask 168 is disposed over interconnect area 126c to block shielding layer 170 from being formed directly on the antenna block or modular interconnect unit 134, respectively. Shielding layer 170 is formed on masks 166 and 168 instead of the underlying portions of package 140. Shielding layer 170 being formed on antenna block 126a in the final package would degrade antenna performance. Shielding layer 170 being formed on modular interconnect unit 134 would short circuit the terminals used later for electrical connection.

Figures 2I, 2J:
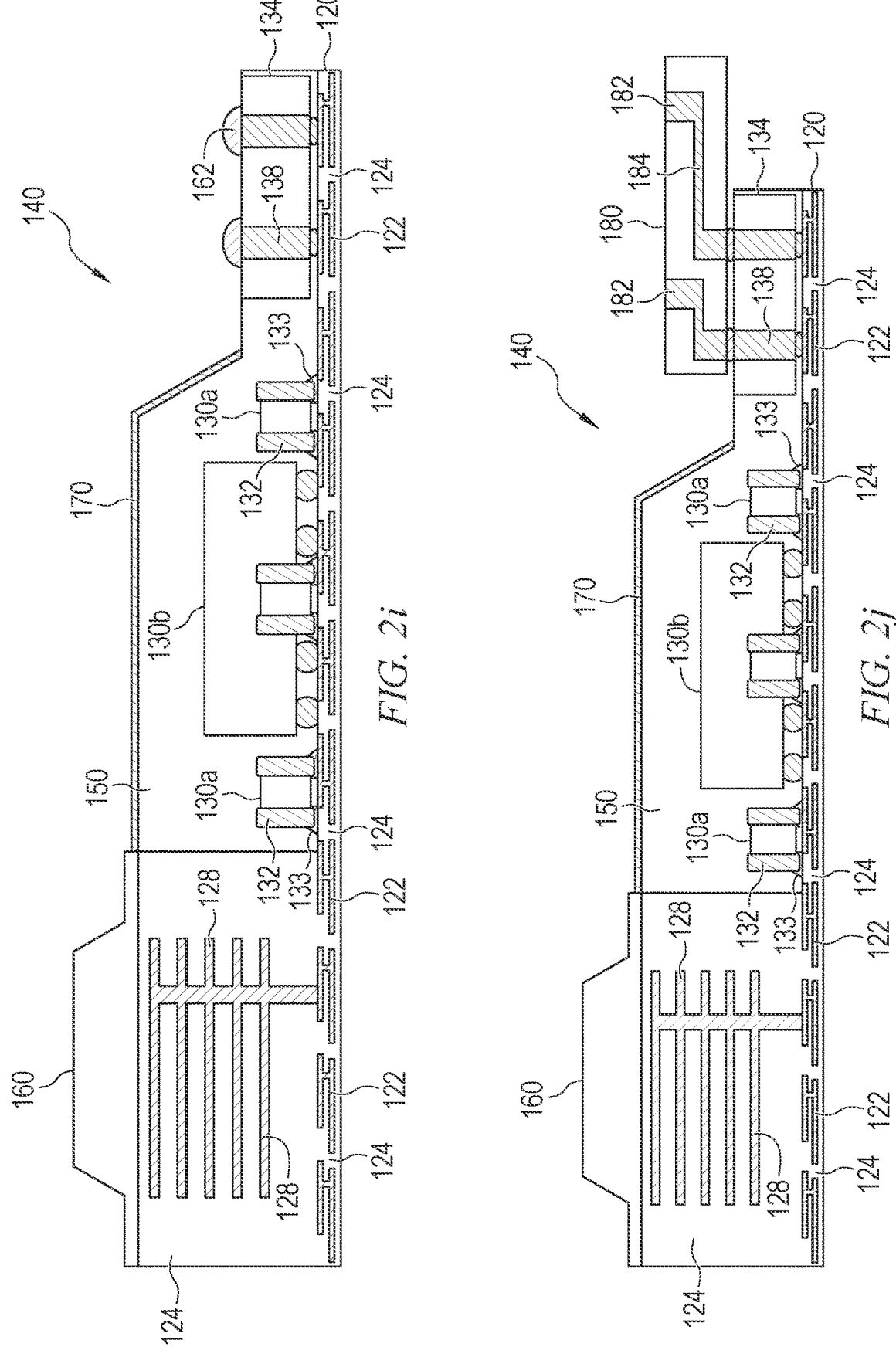

In FIG. 2i, masks 166 and 168 are removed to leave package 140 with shielding layer 170 formed only over component area 126b and not over antenna block 126a or interconnect area 126c. Masks 166 and 168 are removed using the same pick and place process or machine as used to dispose the masks over package 140. Masks 166 and 168 can be reused over additional semiconductor packages after being removed. Shielding layer 170 protects the underlying components 130 from potential malfunction due to electromagnetic interference (EMI).

In FIG. 2j, a connector 180 is mounted to modular interconnect unit 134. Connector 180 is physically and electrically connected to modular interconnect unit 134 by solder bumps 162. Connector 180 fans-out the electrical terminals of modular interconnect unit 134 using vias 182 and conductive traces 184. Connector 180 can simply be used for fan-out and leave contact pads, solder bumps, pins, or other interconnect structures exposed on the top surface of the connector. In other embodiments, connector 180 includes a board-to-board (B2B) connector, ribbon cable connector, or another type of inter-device connector. Having encapsulant 150 in interconnect area 126c recessed relative to the encapsulant in component area 126b keeps connector 180 below the top surface of the package, which helps to physically protect the connector.

FIG. 2j shows a completed package 140. The bottom surface of substrate 120 remains flat and completely covered in insulating layer 124. External electrical interconnect is solely via connector 180. Electrical components 130 are connected to connector 180 through modular interconnect unit 134 and substrate 120. In other embodiments, contact pads of conductive layer 122 are exposed on the bottom surface of substrate 120 as a land-grid array. In another embodiment, bumps or other interconnect structure are mounted onto the contact pads for interconnect to an underlying substrate. Semiconductor package 140 is an AiP module with a high-k encapsulant 160 disposed over antennae 128. High-k encapsulant 160 improves performance of antennae 128. Cost is reduced by having a conventional encapsulant 150 used in combination with the high-k encapsulant 160.

Figure 3A:
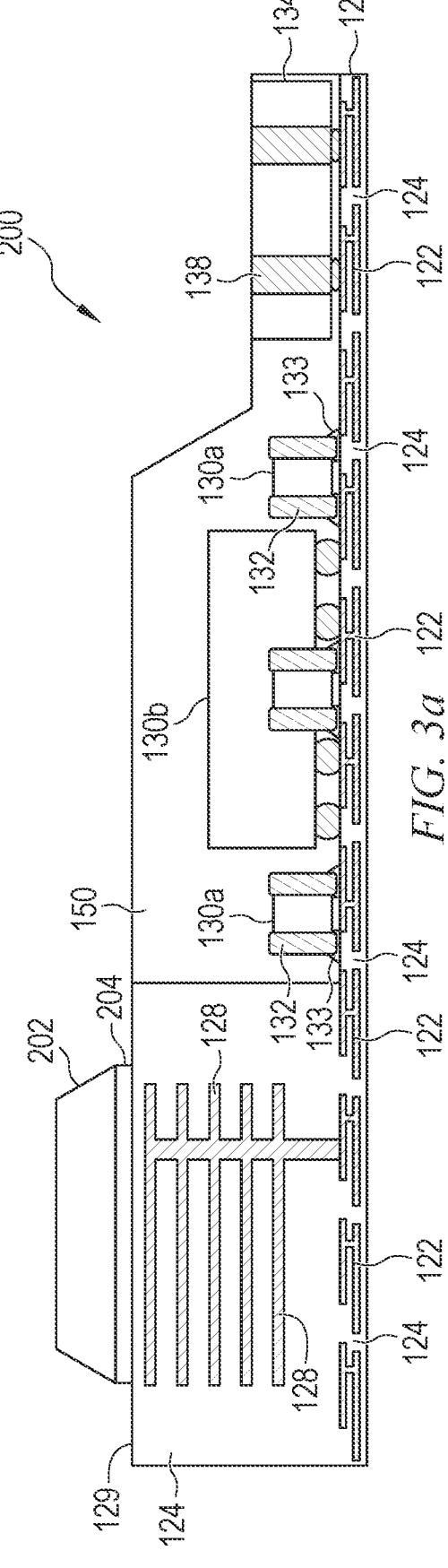
FIGS. 3a and 3b illustrate an alternative molding embodiment.
Figure 3B:
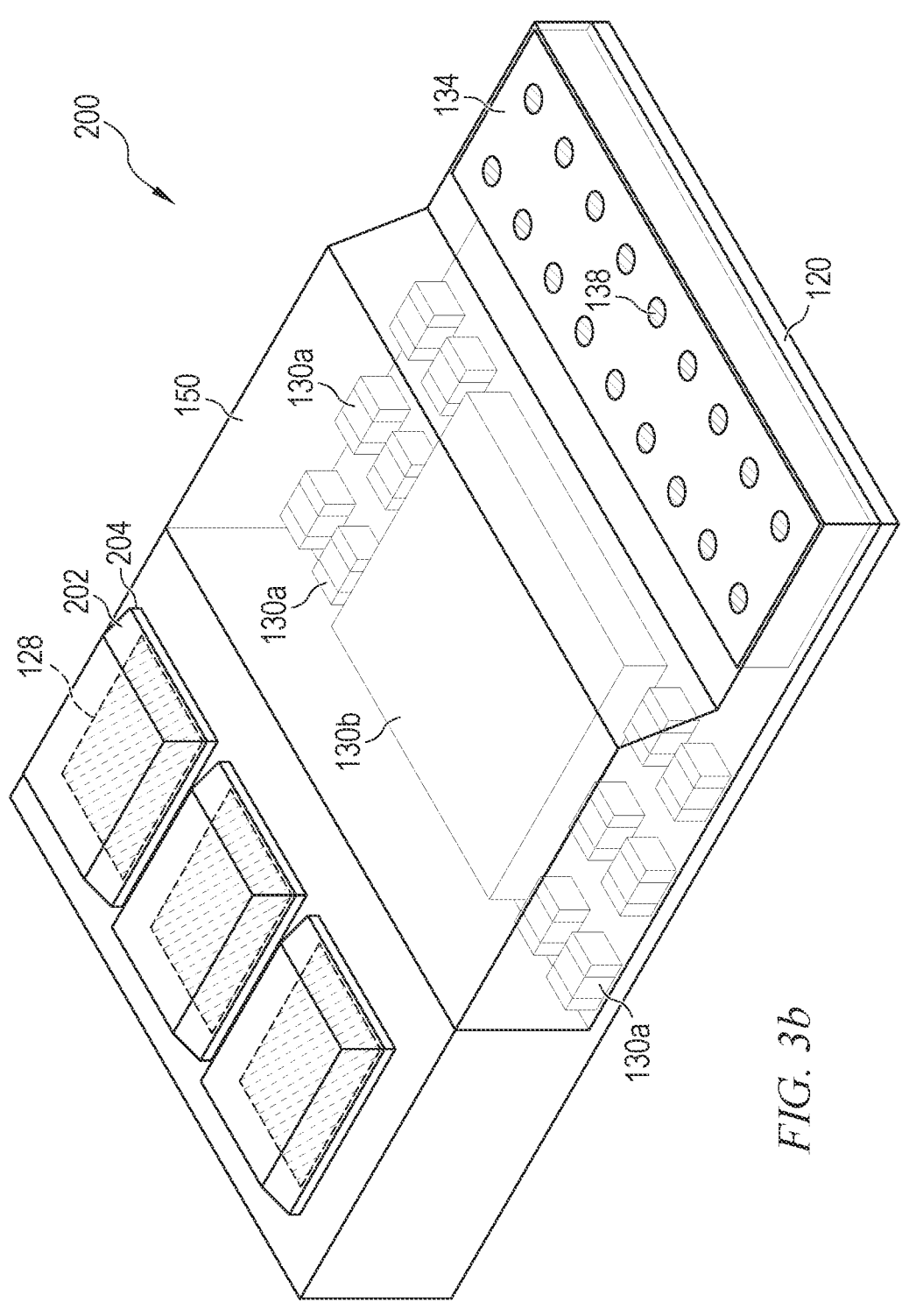

High-k encapsulant 160 in FIG. 2j was molded onto the top of antenna block 126a. FIGS. 3a and 3b show an embodiment where semiconductor package 200 is made with a pre-molded high-k block 202 instead of high-k encapsulant 160. FIG. 3a is a cross-sectional view while FIG. 3b is a perspective view. High-k block 202 is a similar or the same high dielectric constant material as high-k encapsulant 160. Instead of molding directly onto antenna block 126a, high-k block 202 is separately molded and then mounted to antenna block 126a using adhesive 204. High-k block 202 has the same trapezoidal shape as trapezoid portion 160b, but any other suitable shape is possible. In one embodiment, high-k block 202 is cut from a large sheet of material having the desired thickness. A separate high-k block 202 is mounted over each antenna 128 of antenna block 126a. In another embodiment, one larger block is used for multiple antennae 128 per semiconductor package 200. High-k blocks 202 reduce costs due to a reduction in the amount of molding material required when the molded areas over each antenna 128 no longer need to be connected by additional high-k encapsulant.

Figures 4A, 4B:
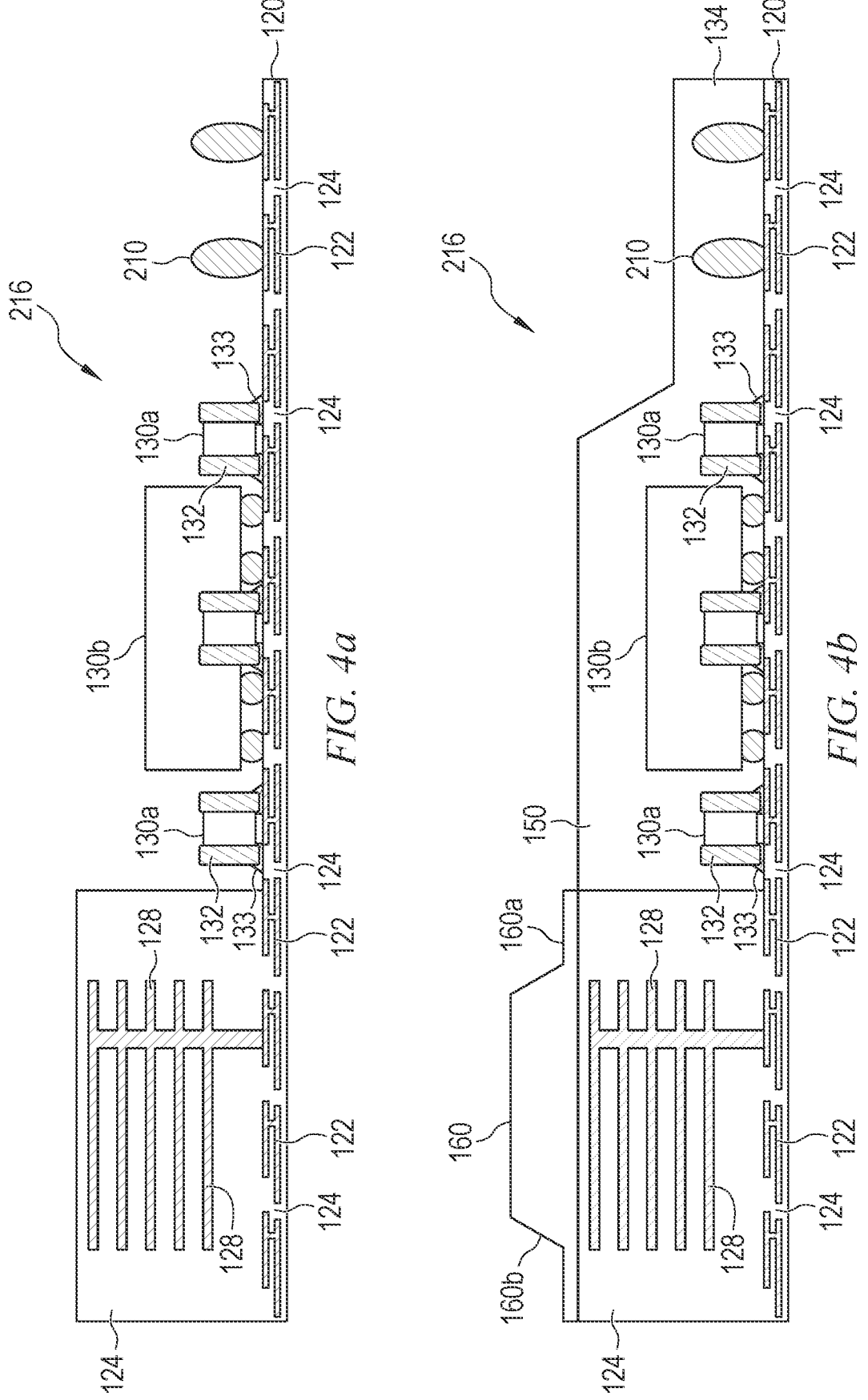
FIGS. 4a-4c illustrate conductive bumps used for external interconnect.
Figure 4C:
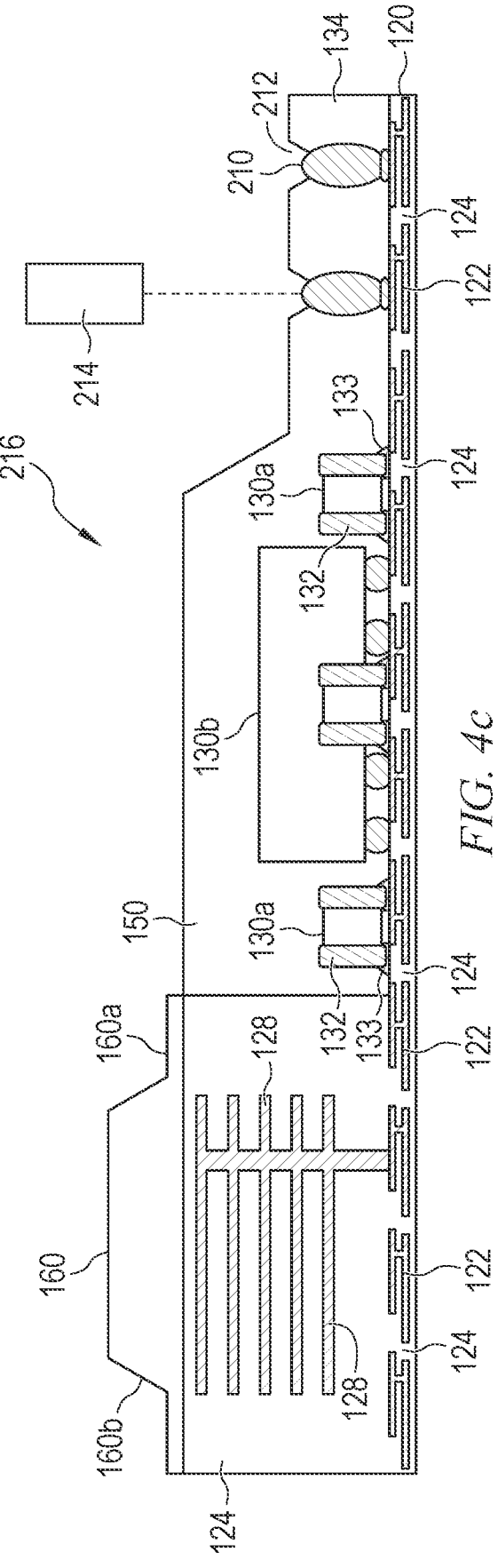

FIGS. 4a-4c show solder bumps 210 used as an alternative to modular interconnect unit 134. FIG. 4a shows solder bumps 210 disposed on contact pads of conductive layer 122. Bumps 210 are formed in a manner and of materials similar to those disclosed above for bumps 114 on semiconductor die 104. In FIG. 4b, encapsulant 150 is deposited over bumps 210 in a similar manner to the depositing of encapsulant 150 in FIG. 2d. Bumps 210 are completely covered by encapsulant 150. In other embodiments, bumps 210 are exposed from encapsulant 150 by using film-assisted molding or by mechanical planarization of interconnect area 126c after depositing encapsulant 150.

In FIG. 4c, bumps 210 are exposed for external interconnect by forming openings 212 through encapsulant 150 with a laser 214 to continue manufacturing semiconductor package 216. Alternatively, openings 212 can be formed with mechanical drilling or chemical etching. Openings 212 expose solder bumps 120. Additional solder or solder paste can be disposed into openings 212 so that the combined amount of solder extends over the top surface of encapsulant 150 within interconnect area 126c similar to conductive bumps 162. Connector 180 can then be attached by reflowing bumps 210 with the connector physically touching the bumps. In another embodiment, solder bumps are disposed on the bottom of connector 180 to bridge the potential gap between the connector and solder bumps 210. Other than the steps shown in FIGS. 4a-4c, manufacturing of package 216 proceeds the same as disclosed above for semiconductor package 140 in FIGS. 2a-2j.

Figures 5A, 5B:
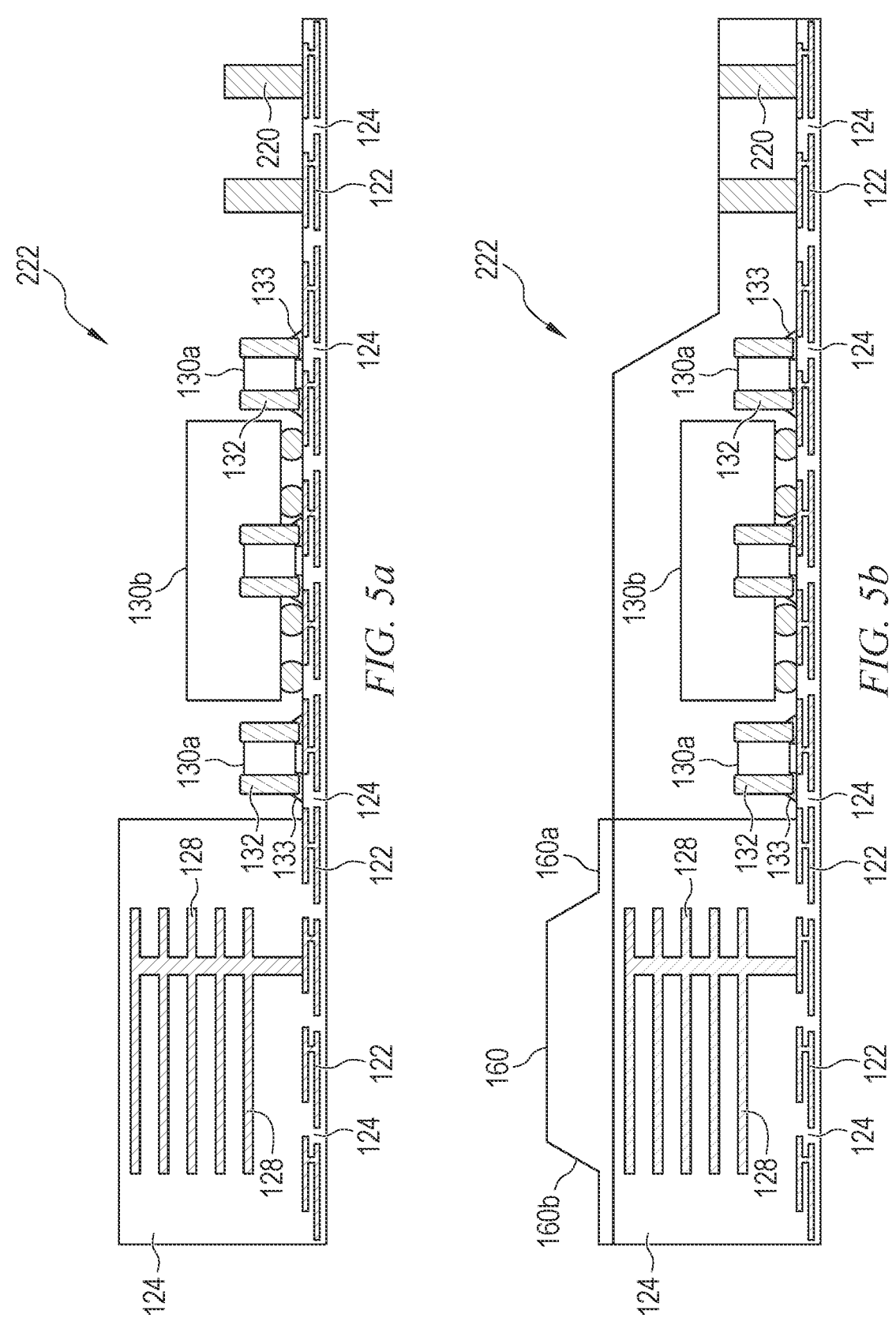
FIGS. 5a and 5b illustrate conductive pillars used for external interconnect.

FIGS. 5a and 5b illustrate another embodiment with conductive pillars 220 used for external interconnect instead of modular interconnect unit 134 or bumps 210. Conductive pillars 220 are disposed on contact pads of substrate 120 in FIG. 5a. Pillars 220 can be metal deposited into a mask opening over substrate 120 prior to the mask being removed. Any suitable metal deposition process can be used, such as those used to form conductive layers 122. In another embodiment, pillars 220 are separately formed and then disposed onto substrate 120. Pillars 220 are formed from copper, gold, aluminum, iron, tungsten, combinations thereof, or another suitable electrically conductive material.

Encapsulant 150 is deposited over pillars 220 in FIG. 5b to continue manufacturing semiconductor package 222. Pillars 220 are exposed from encapsulant 220 by using film-assisted molding or another molding process that prevents the encapsulant from covering the pillars. In another embodiment, interconnect area 126c is planarized after deposition of encapsulant 150 to expose pillars 220. Bumps 162 are disposed on pillars 220 to attach connector 180 as discussed above. An under-bump metallization or contact pad is optionally formed over pillars 220 after depositing encapsulant 150. Other than the steps shown in FIGS. 5a and 5b, manufacturing of package 222 proceeds the same as disclosed above for semiconductor package 140 in FIGS. 2a-2j.

Figures 6A, 6B:
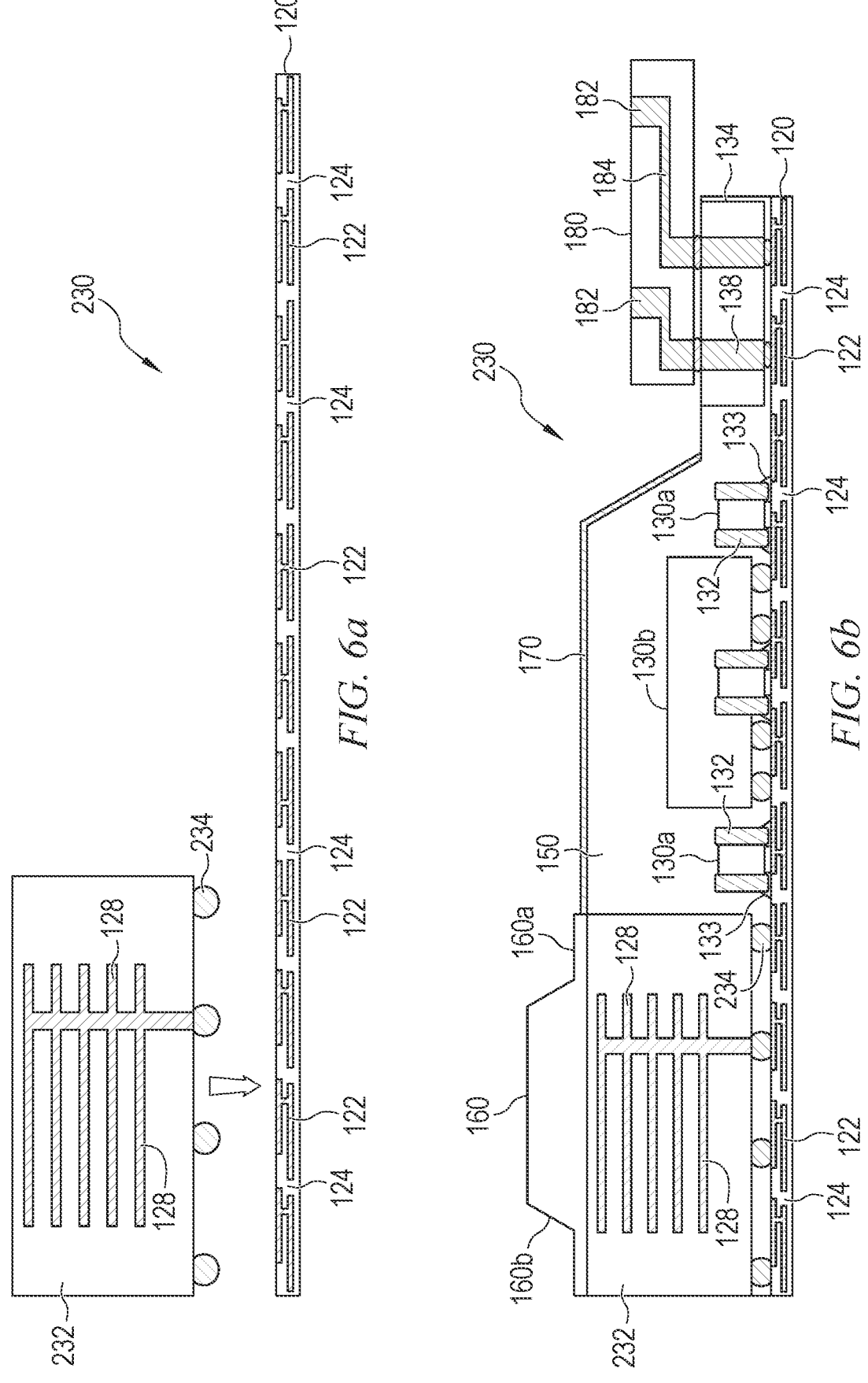
FIGS. 6a and 6b illustrate an embodiment with a separately formed antenna block.

FIGS. 6a and 6b illustrate a semiconductor package 230 being formed with an antenna block 232 formed separately from substrate 120. Antenna block 232 has all the qualities and is formed similar to antenna block 126a above, except being formed as a block separately from substrate 120. Antenna block 232 has contact pads or another suitable interconnect structure on the bottom of the antenna block to allow bumps 234 to electrically and mechanically connect the antenna block to substrate 120. Antenna block 232 is disposed over and mounted to substrate 120 in FIG. 6a. Bumps 234 are reflowed between antenna block 232 and conductive layer 122 of substrate 120 to attach the antenna block.

Besides antenna block 232 being formed separately from substrate 120 and attached by solder bumps 234 or another suitable interconnect structure, package 230 is formed in substantially the same process as disclosed above. FIG. 6b shows the completed package with two separate encapsulants 150 and 160. Connector 180 is mounted over modular interconnect unit 134. Solder bumps 210 or conductive pillars 220 can be used with package 230 instead of modular interconnect unit 134. High-k block 202 can be used instead of high-k encapsulant 160.

Figure 7:
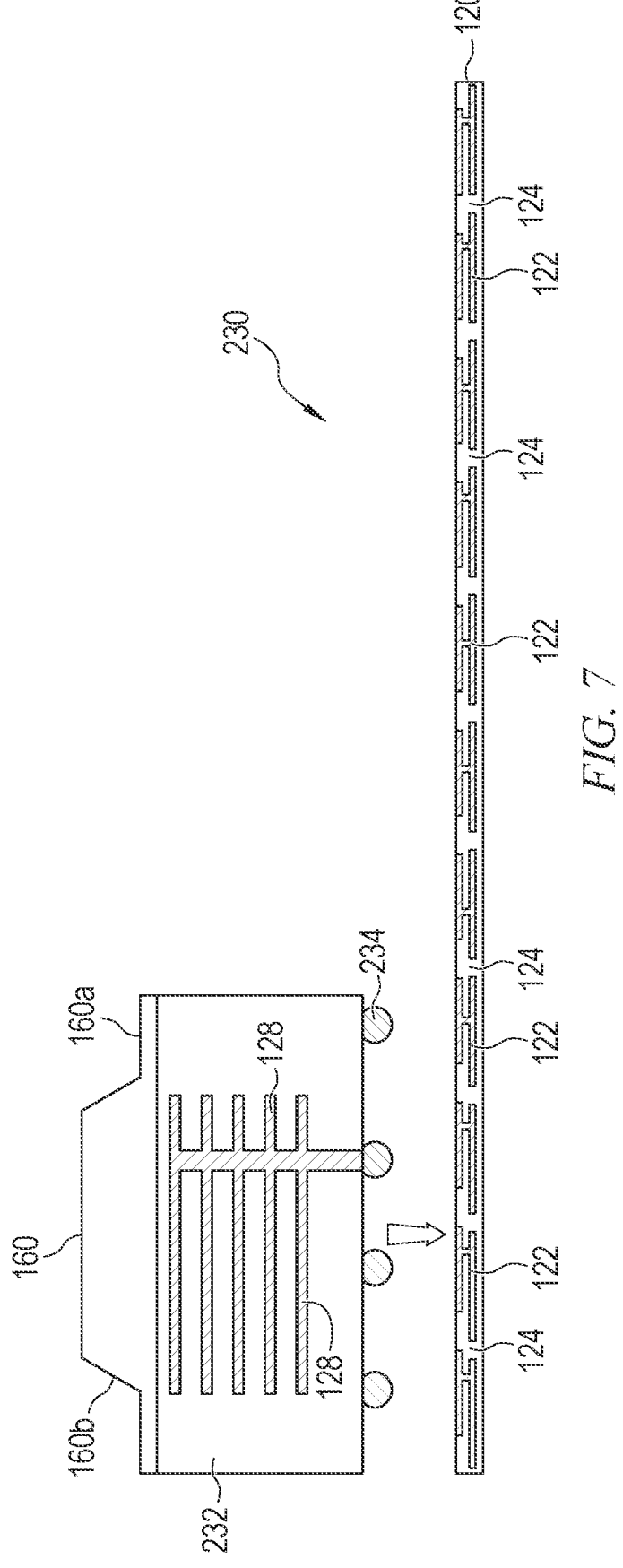
FIG. 7 shows pre-molded high dielectric constant encapsulant on the separately formed antenna block.

Alternatively, high-k encapsulant 160 or high-k block 202 can be applied onto antenna block 232 prior to the antenna block being installed onto substrate 120, as shown in FIG. 7. Pre-applied encapsulant 160 can be used with any of the above-disclosed embodiments.

Figure 8:
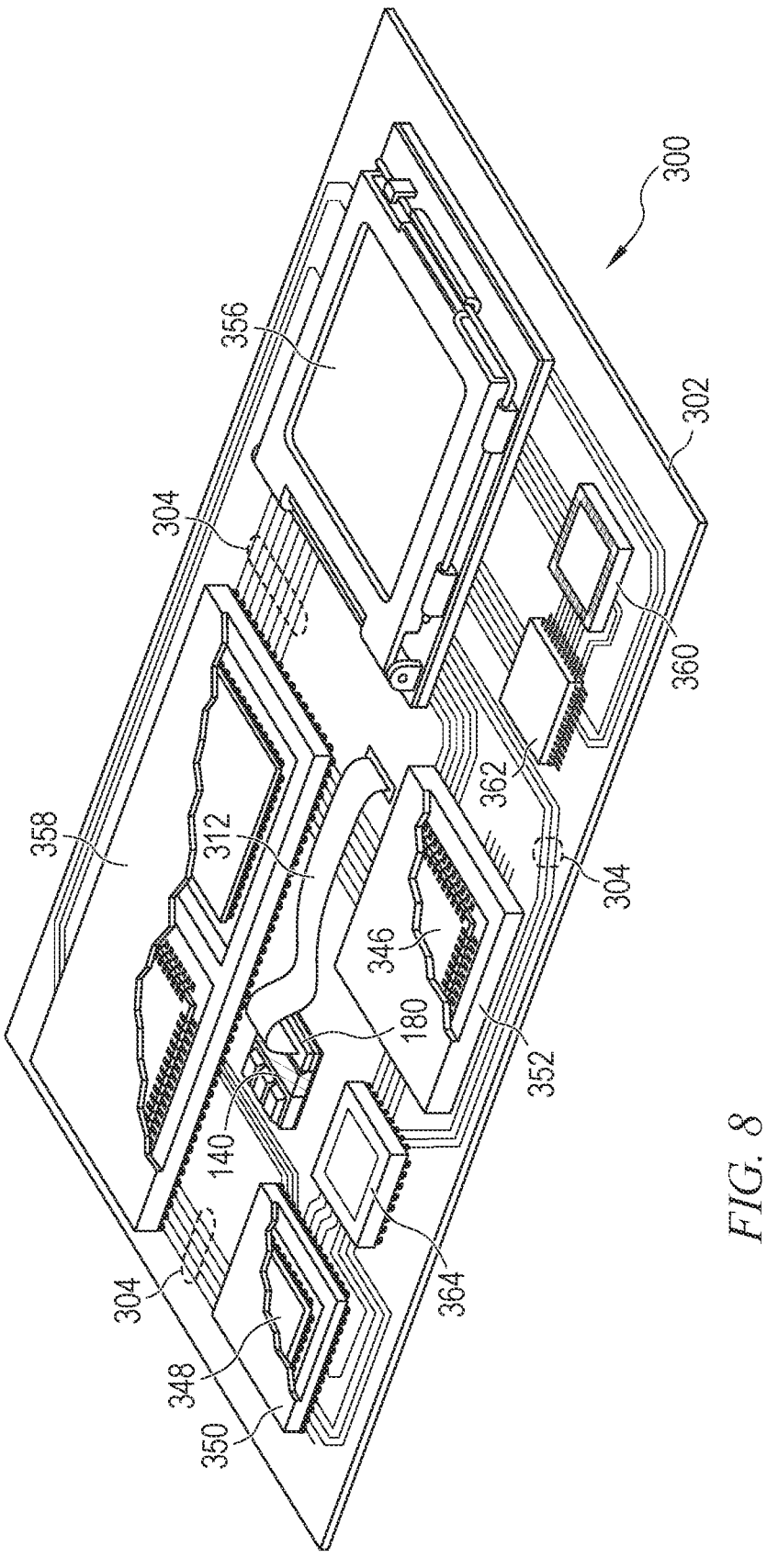
FIG. 8 illustrates an electronic device with different types of packages disposed on a printed circuit board (PCB).

FIG. 8 illustrates integrating the above-described semiconductor packages, e.g., semiconductor package 140, into a larger electronic device 300. Electronic device 300 includes PCB 302 with a plurality of semiconductor packages mounted on a surface of the PCB, including semiconductor package 140. In one embodiment, electronic device 300 is a mobile phone and PCB 302 is the main board or a sub assembly of the phone. Semiconductor package 140 is mounted using a liquid adhesive, adhesive tape, or other suitable means to attach the package to PCB 302. A ribbon cable 312 has a connector that snaps into or otherwise interfaces with connector 180. Ribbon cable 312 routes electrical signals to another connector on PCB 302 or to another package mounted to the PCB. Electrical components 130 are electrically coupled to PCB 302 through substrate 120, connector 180, and ribbon cable 312.

Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 8, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with semiconductor package 140. Conductive traces 304 electrically couple the various packages and components disposed on PCB 302 to semiconductor package 140, giving use of electrical components 130 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate including an antenna formed in a first area of the substrate, wherein a thickness of the first area of the substrate is greater than a thickness of a second area of the substrate and also greater than a thickness of a third area of the substrate, and wherein the first area of the substrate is formed thicker by successively forming upper conductive layers and upper insulating layers over the first area directly on lower conductive layers and lower insulating layers that extend over the first area, the second area, and the third area;

disposing an electrical component over the second area of the substrate;

disposing an interconnect structure over the third area of the substrate;

depositing a first encapsulant over the electrical component and interconnect structure, wherein the first encapsulant extends over only the second area and third area without extending over the first area after depositing the first encapsulant; and disposing a second encapsulant over the antenna, wherein the second encapsulant includes a higher dielectric constant than the first encapsulant, and wherein the second encapsulant includes a trapezoidal portion over the antenna.

2. The method of claim 1, further including mounting the second encapsulant to the substrate over the antenna using an adhesive.

3. The method of claim 1, further including mounting a connector over the interconnect structure.

4. The method of claim 1, wherein the interconnect structure includes an insulating core and a conductive via formed through the insulating core.

5. The method of claim 1, further including depositing the first encapsulant with a top surface of the first encapsulant in the second area of the substrate coplanar to a top surface of the substrate in the first area of the substrate.

6. A method of making a semiconductor device, comprising:

providing a substrate including an antenna formed in or disposed over a first area of the substrate, wherein a thickness of the first area of the substrate is greater than a thickness of a second area of the substrate, and wherein the first area of the substrate is formed thicker by successively forming upper conductive layers and upper insulating layers over the first area directly on lower conductive layers and lower insulating layers that extend over the first area and the second area;

disposing an electrical component over the second area of the substrate;

depositing a first encapsulant over the electrical component, wherein the first area remains devoid of the first encapsulant after depositing; and disposing a second encapsulant over the antenna, wherein the second encapsulant includes a higher dielectric constant than the first encapsulant, and wherein the second encapsulant includes a trapezoidal portion over the antenna.

7. The method of claim 6, further including disposing an adhesive between the substrate and the second encapsulant.

8. The method of claim 6, further including mounting a connector over the first encapsulant.

9. The method of claim 6, wherein the substrate includes a first thickness in the first area of the substrate greater than a second thickness of the substrate in the second area.

10. The method of claim 9, further including depositing the first encapsulant with a top surface of the first encapsulant in the second area of the substrate coplanar to a top surface of the substrate in the first area of the substrate.

11. A method of making a semiconductor device, comprising:

providing a substrate including an antenna formed in or disposed over a first area of the substrate, wherein a thickness of the first area of the substrate is greater than a thickness of a second area of the substrate, and wherein the first area of the substrate is formed thicker by successively forming upper conductive layers and upper insulating layers over the first area directly on lower conductive layers and lower insulating layers that extend over the first area and the second area;

disposing an electrical component over the second area of the substrate;

depositing a first encapsulant over the electrical component; and disposing a second encapsulant over the antenna, wherein the second encapsulant includes a higher dielectric constant than the first encapsulant.

12. The method of claim 11, further including disposing an adhesive between the substrate and the second encapsulant.

13. The method of claim 11, further including mounting a connector over the first encapsulant.

14. The method of claim 11, wherein the substrate includes a first thickness in the first area of the substrate greater than a second thickness of the substrate in the second area.

15. The method of claim 14, further including depositing the first encapsulant with a top surface of the first encapsulant in the second area of the substrate coplanar to a top surface of the substrate in the first area of the substrate.

* * * * *